(12) United States Patent
Flohr

(10) Patent No.: US 6,892,370 B2
(45) Date of Patent: May 10, 2005

(54) COMPUTERIZED STANDARD CELL LIBRARY FOR DESIGNING INTEGRATED CIRCUITS (ICS) WITH HIGH METAL LAYER INTRA CELL SIGNAL WIRING, AND ICS INCLUDING SAME

(75) Inventor: Dorit Flohr, Jerusalem (IL)

(73) Assignee: Silicon Design Systems Ltd., Jerusalem (IL)

( * ) Notice: Subject to any disclaimer, the term of this patent is extended or adjusted under 35 U.S.C. 154(b) by 0 days.

(21) Appl. No.: 10/404,670

(22) Filed: Apr. 2, 2003

(65) Prior Publication Data

US 2004/0195690 A1 Oct. 7, 2004

(51) Int. Cl.[7] ............................................. G06F 17/50
(52) U.S. Cl. ............................ 716/12; 716/14; 716/17
(58) Field of Search ................................ 257/207, 208, 257/211; 716/12, 14, 17

(56) References Cited

U.S. PATENT DOCUMENTS

| | | | | |
|---|---|---|---|---|
| 4,742,383 A | * | 5/1988 | Fitzgerald | ................... 257/211 |
| 5,111,271 A | * | 5/1992 | Hatada et al. | ............... 257/207 |
| 5,468,977 A | | 11/1995 | Machida | ..................... 257/208 |
| 5,656,834 A | * | 8/1997 | Grzyb et al. | ................. 257/207 |
| 5,977,574 A | * | 11/1999 | Schmitt et al. | ............. 257/207 |
| 6,407,434 B1 | * | 6/2002 | Rostoker et al. | ............ 257/211 |
| 6,448,631 B2 | | 9/2002 | Gandhi et al. | ............... 257/211 |

OTHER PUBLICATIONS

Virage Logic Corporation: "ASAP Standard Cell Libraries", www.viragelogic.com, 2002.

* cited by examiner

*Primary Examiner*—Trong Phan
(74) *Attorney, Agent, or Firm*—Blakely, Sokoloff, Taylor & Zafman LLP

(57) ABSTRACT

The present invention is for a computerized standard cell library with inter alia standard cells having high metal layer intra cell signal wiring for use in designing ICs in accordance with a standard cell IC design methodology. High metal layer intra cell signal wiring in accordance with the present invention arises to wire segments in an IC's high interconnect metal layer exclusively reserved for horizontal wire segments being constrained to a limited number of horizontal routing tracks, thereby leaving the remaining horizontal routing tracks unimpeded for inter cell signal wiring purposes.

30 Claims, 4 Drawing Sheets

LEGEND
- M2 INTRA CELL SIGNAL WIRING
- M2 INTER CELL SIGNAL WIRING

COMPUTERIZED STANDARD CELL LIBRARY FOR DESIGNING INTEGRATED CIRCUITS (ICS) WITH HIGH METAL LAYER INTRA CELL SIGNAL WIRING, AND ICS INCLUDING SAME

FIELD OF THE INVENTION

The invention is in the field of integrated circuit (IC) design in general, and computerized standard cell libraries for designing ICs with high metal layer intra cell signal wiring and ICs including same in particular.

BACKGROUND OF THE INVENTION

Standard cells are designed to implement logic functions each by way of a dedicated electrical circuit including a power rail, a ground rail, signal gates and wire segments to internally interconnect their signal gates (hereinafter referred to as "intra cell signal wiring"). Standard cells are intended to be embodied in an IC's transistor embedded semiconductor substrate, and its interconnect structure which includes a polysilicon layer, and one or more interconnect metal layers. Simple standard cells having only a few signal gates require relatively little intra cell signal wiring embodied as a few wire segments which can be conveniently routed through an IC's polysilicon layer and the lowermost interconnect metal layer immediately overlying its polysilicon layer hereinafter denoted M1. Standard cells have a uniform height spanning a predetermined number of imaginary horizontal routing tracks so that they can be deployed side-by-side to constitute horizontal standard cell rows spanning the same number of imaginary horizontal routing tracks.

In accordance with conventional standard cell IC design methodology, a so-called "place and route" software accesses a computerized standard cell library to initially place standard cells in standard cell rows in accordance with a predetermined netlist, and then determines the wire segments to interconnect signal gates of different standard cells within the same or different standard cell rows (hereinafter referred to as "inter cell signal wiring"). To improve area utilization, standard cell rows are typically arranged in pairs with a common M1 ground rail between a pair of inverted juxtaposed standard cell rows. To reduce the complexity of inter cell signal wiring, inter cell signal wiring wire segments are preferably either entirely horizontal or vertical oriented on any particular high interconnect metal layer M2, M3, M4, and above, and preferably horizontal and vertical oriented on alternate high interconnect metal layers.

More complex standard cells require more intra cell signal wiring wire segments which whilst they could still theoretically be solely routed through an IC's polysilicon layer and its M1 they would lead to undesirably wide footprints since they are constrained in their height, thereby reducing area efficiency. To overcome this, it has been proposed to additionally utilize a high interconnect metal layer dedicated to having horizontal oriented wire segments for intra cell signal wiring purposes as opposed to being previously exclusively restricted for inter cell signal wiring purposes. However, this may lead to many, and in the worst possible scenario all, of the selected high interconnect metal layer's routing tracks having one or more intra cell signal wiring wire segments somewhere therealong, thereby undesirably militating against its availability for inter cell signal wiring purposes.

SUMMARY OF THE INVENTION

The present invention is for a computerized standard cell library having inter alia standard cells with high metal layer intra cell signal wiring for use in designing ICs in accordance with conventional standard cell IC design methodology. The present invention is intended to balance between the desire to obtain area reduction of more complex standard cells' footprints by virtue of high metal layer intra cell signal wiring and the reduced availability of the high interconnect metal layer selected for intra cell signal wiring purposes for inter cell signal wiring purposes. This is achieved by all intra cell signal wiring on the selected high interconnect metal layer irrespective of the individual standard cells being constrained to certain horizontal routing tracks, thereby leaving the other horizontal routing tracks exclusively available for inter cell signal wiring in addition to the those horizontal routing tracks employed for intra cell signal wiring. Mathematically speaking, the high metal layer intra cell signal wiring of each of the standard cells of a computerized standard cell library in accordance with the present invention is constrained to one or more of the same $n \leq \frac{1}{2} m$ horizontal routing tracks where m is the number of horizontal routing tracks spanned by a standard cell. Thus, whilst different standard cells may have high metal layer intra cell signal wiring on different horizontal routing tracks, any combination of standard cells within a standard cell row will necessarily comply with this constraint. The actual ratio may in fact be smaller, for example, $n \leq \frac{1}{4} m$, $n \leq 2$, and the like, depending on several factors, for example, the number of horizontal routing tracks spanned by a standard cell, the complexity of the standard cells, and the like. The selected high interconnect metal layer for intra cell signal wiring is preferably the lowermost high interconnect high metal layer reserved for horizontal wire segments, and is preferably M2. It should be appreciated that the present invention may also be implemented as an article of manufacture, a computer system, and an IC.

BRIEF DESCRIPTION OF THE DRAWINGS

In order to understand the invention and to see how it can be carried out in practice, a preferred embodiment will now be described, by way of a non-limiting example only, with reference to the accompanying drawings, in which similar parts are likewise numbered, and in which.

DETAILED DESCRIPTION OF PREFERRED EMBODIMENT

Figure 1:
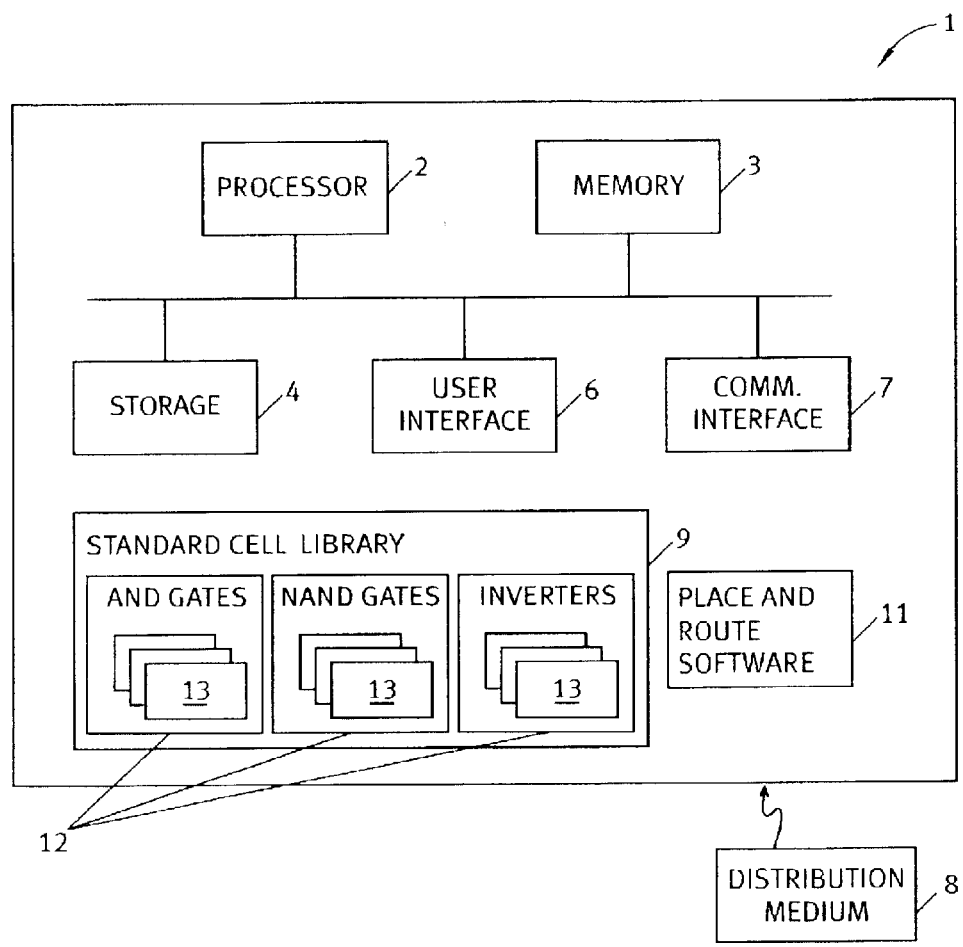
FIG. 1 is a block diagram of a general purpose computer system capable of storing a computerized standard cell library.

FIG. 1 shows a general purpose computer system 1 including a processor 2, system memory 3, non-volatile storage 4, a user console 6 including a keyboard, a mouse, a display, and the like, and a communication interface 7. The constitution of each of these elements is well known and each performs its conventional function as known in the art and accordingly will not be described in greater detail. In particular, the system memory 3 and the non-volatile storage 4 are employed to store a working copy and a permanent copy of the programming instructions implementing the present invention, and to store IC designs, and standard cell architectures. The permanent copy of the programming instructions to practice the present invention may be loaded into the non-volatile storage 4 in the factory, or in the field, through communication interface 7, or through distribution medium 8. Any one of a number of recordable medium such as tapes, CD-ROM, DVD and so forth may be employed to store the programming instructions for distribution purposes. The computer system 1 is capable of storing a computerized standard cell library 9 accessible by a place and route software 11, for example, as commercially available from Synopsys Inc., USA. The standard cell library 9 is classified into directories 12 of different logic functions, for example, AND gates, NAND gates, inverters, and the like. Each directory 11 includes sub-directories 13 for different sized standard cells, for example, an A+B AND gate, an A+B+C AND gate, and the like. For each standard cell, its sub-directory 13 includes a number of files each in a different format, for example, GDS II for layout polygon description, LEF for cell footprint description, and the like. In addition, a library contains a set of general files that contain a particular concatenated view of all cells employed for interfacing with the different design and verification tools.

Figure 2:
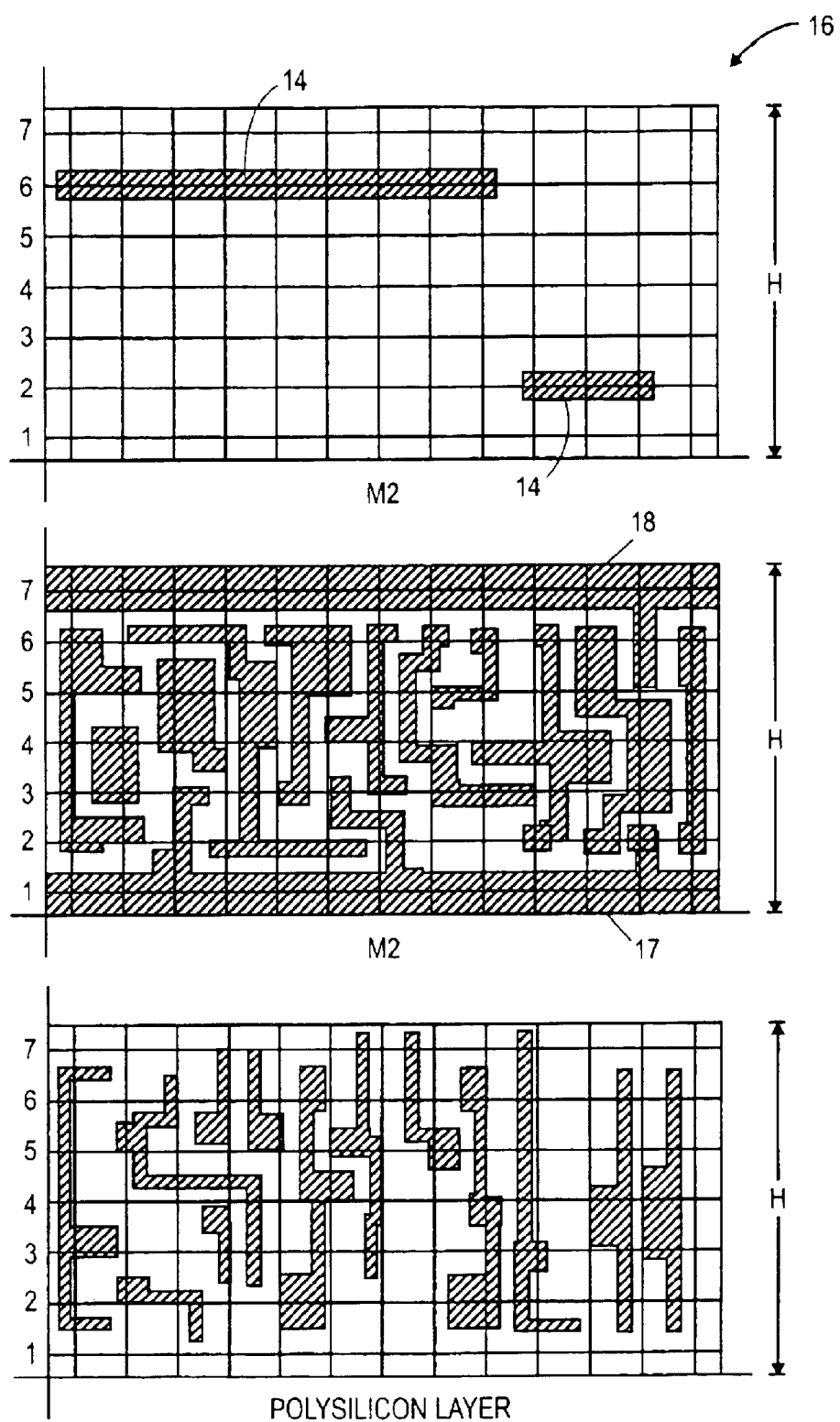
FIG. 2 is a layout representation of the entire intra cell signal wiring of an exemplary standard cell having high metal layer intra cell signal wiring.

FIG. 2 shows the entire layout of the intra cell signal wiring 14 of a standard cell 16 of a uniform height H spanning seven horizontal routing tracks residing on three layers: the polysilicon layer, lowermost interconnect metal layer M1, and lowermost high interconnect metal layer M2. The M1 intra cell signal wiring includes a ground rail 17 and a power rail 18. The M2 intra cell signal wiring is restricted to horizontal routing tracks 2 and 6.

Figure 3:
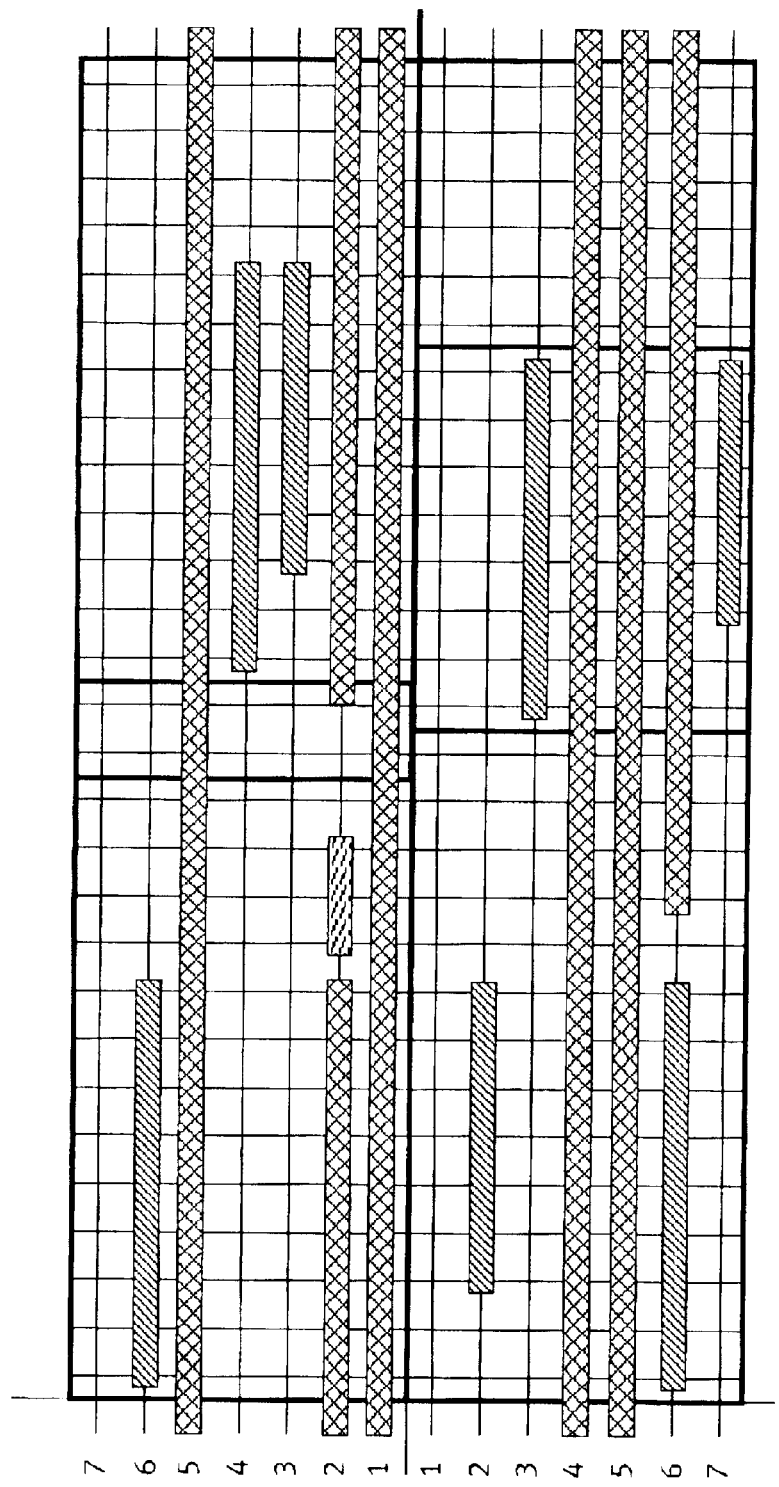
FIG. 3 is a M2 layout representation of a portion of an exemplary standard cell row constructed from standard cells with conventional high metal layer intra cell signal wiring.

FIG. 3 shows hatched wire segments arising from conventional high metal layer intra cell signal wiring being deployed somewhere along nearly each of the M2 horizontal routing tracks, thereby severely militating against cross hatched inter cell signal wiring.

Figure 4:
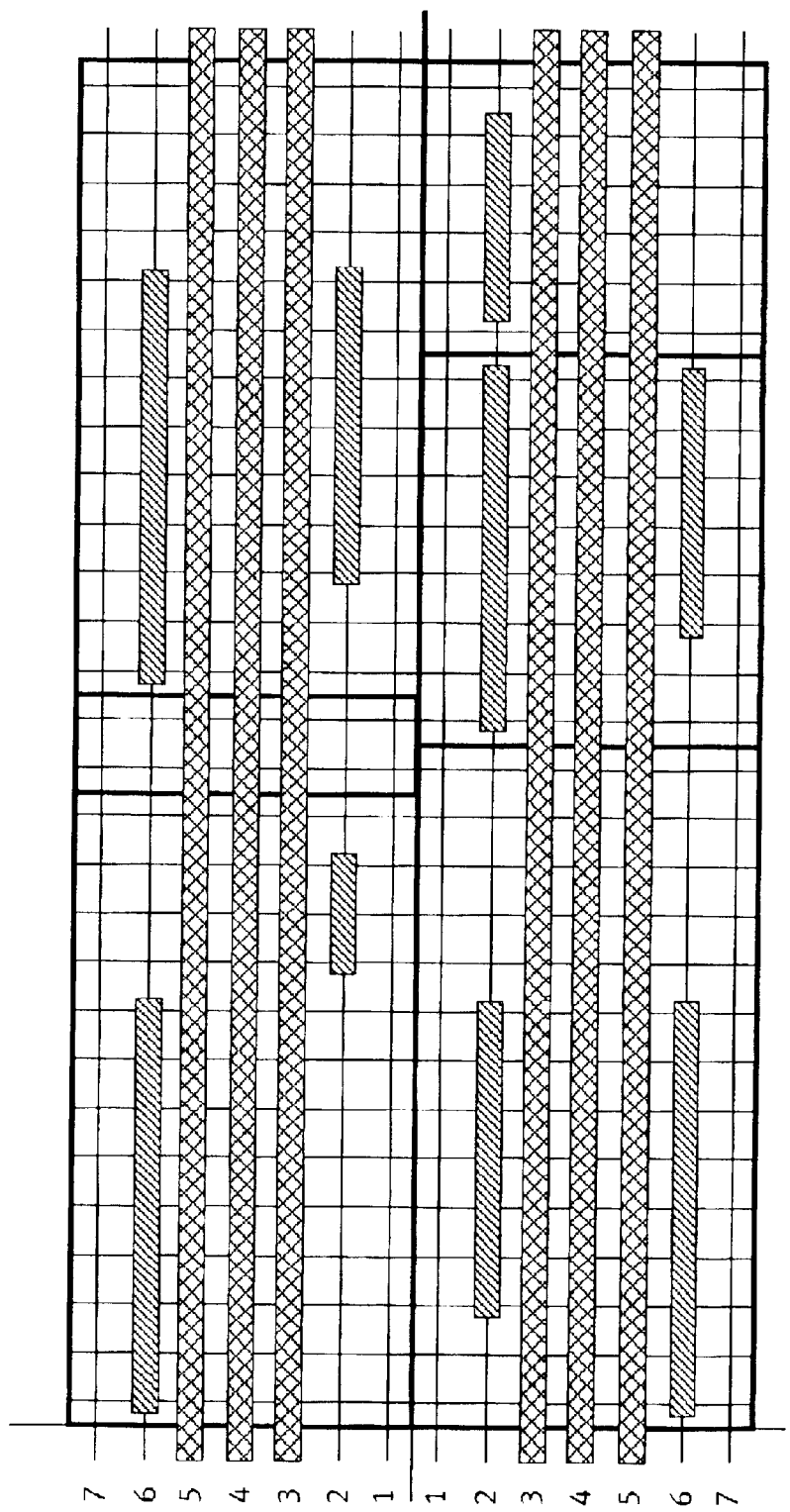
FIG. 4 is a M2 layout representation of a portion of an exemplary standard cell row constructed from standard cells with high metal layer intra cell signal wiring in accordance with the present invention.

FIG. 4 shows hatched wire segments arising from high metal layer intra cell signal wiring in accordance with the present invention being constrained to horizontal routing tracks 2 and 6, thereby only mildly militating against cross hatched inter cell signal wiring.

While the invention has been described with respect to a limited number of embodiments, it will be appreciated that many variations, modifications, and other applications of the invention can be made within the scope of the appended claims.

What is claimed is:

1. A computerized standard cell library comprising:
   a plurality of standard cells, each of the standard cells including
   a plurality of signal gates and one or more wire segments for internally interconnecting the plurality of signal gates within the respective cell spanning across m horizontal routing tracks,
   a first interconnect metal layer, and
   a second interconnect metal layer overlaying the first interconnect metal layer, wherein one or more intra cell signal wires are disposed on no more than n number of horizontal routing tracks of the second interconnect metal layer, and wherein $n < \frac{1}{2} m$.

2. The library according to claim 1 wherein $n \leq \frac{1}{4} m$.

3. The library according to claim 1 wherein $n \leq 2$.

4. The library according to claim 1 wherein each of the one or more intra cell signal wires of the second metal layer resides on a non-neighboring horizontal routing tracks with respect to a remainder of the intra cell signal wires.

5. The library according to claim 1 wherein each of the standard cells comprises one or more inter cell signal wires disposed on one or more horizontal routing tracks of the second metal layer other than the routine track occupied by the intra cell signal wires, the one or more inter cell signal wires coupling the respective standard cell with one or more other standard cells.

6. The library according to claim 5, wherein the second metal layer is M2.

7. An article of manufacture comprising a recordable medium having instructions recorded thereon to cause a machine to perform operations, the operations comprising:
   positioning a plurality of signal gates spanning across m number of horizontal routing tracks of a standard cell, and
   depositing one or more intra cell signal wires on no more than n number of horizontal routing tracks of a second metal layer overlaying a first metal layer of the standard cell, wherein the one or more intra cell signal wires interconnect the plurality of signal gates within the standard cell, and wherein $n < \frac{1}{2} m$.

8. The article of manufacture according to claim 7 wherein $n \leq \frac{1}{4} m$.

9. The article of manufacture according to claim 7 wherein $n \leq 2$.

10. The article of manufacture according to claim 7 wherein each of the one or more intra cell signal wires of the second metal layer resides on a non-neighboring horizontal routing tracks with respect to a remainder of the intra cell signal wires.

11. The article of manufacture according to claim 7 wherein each of the standard cells comprises one or more inter cell signal wires disposed on one or more horizontal routing tracks of the second metal layer other than the routing track occupied by the intra cell signal wires, the one or more inter cell signal wires coupling the respective standard cell with one or more other standard cells.

12. The article of manufacture according to claim 11, wherein the second metal layer is M2.

13. A computer system, comprising:
   a processor; and
   a memory having instructions, when executed from the memory, causes the processor to perform operations, the operations including
   positioning a plurality of signal gates spanning across m number of horizontal routing tracks of a standard cell, and
   depositing one or more intra cell signal wires on no more than n number of horizontal routing tracks of a second metal layer overlaying a first metal layer of the standard cell, wherein the one or more intra cell signal wires interconnect the plurality of signal gates within the standard cell, and wherein $n < \frac{1}{2} m$.

14. The system according to claim 13 wherein $n \leq \frac{1}{4} m$.

15. The system according to claim 13 wherein $n \leq 2$.

16. The system according to claim 13 wherein each of the one or more intra cell signal wires of the second metal layer resides on a non-neighboring horizontal routing tracks with respect to a remainder of the intra cell signal wires.

17. The system according to claim 13 wherein each of the standard cells comprises one or more inter cell signal wires disposed on one or more horizontal routing tracks of the second metal layer other than the routing track occupied by the intra cell signal wires, the one or more inter cell signal wires coupling the respective standard cell with one or more other standard cells.

18. The system according to claim 17, wherein the second metal layer is M2.

19. An Integrated Circuit (IC), comprising:
- a plurality of standard cells, each of the standard cells including
  - a plurality of signal gates and one or more wire segments for internally interconnecting the plurality of signal gates within the respective cell spanning across m horizontal routing tracks,
  - a first interconnect metal layer, and
  - a second interconnect metal layer overlaying the first interconnect metal layer, wherein one or more intra cell signal wires are disposed on no more than n number of horizontal routing track of the second interconnect metal layer, and wherein $n < \frac{1}{2} m$.

20. The IC according to claim 19 wherein $n \leq \frac{1}{4} m$.

21. The IC according to claim 19 wherein $n \leq 2$.

22. The IC according to claim 19 wherein each of the one or more intra cell signal wires of the second metal layer resides on a non-neighboring horizontal routing tracks with respect to a remainder of the intra cell signal wires.

23. The IC according to claim 19 wherein each of the standard cells comprises one or more inter cell signal wires disposed on one or more horizontal routing tracks of the second metal layer other than the routing track occupied by the intra cell signal wires, the one or more inter cell signal wires coupling the respective standard cell with one or more other standard cells.

24. The IC according to claim 23. wherein the second metal layer is M2.

25. A computer implemented method, comprising:
- positioning a plurality of signal gates spanning across m number of horizontal routing tracks of a standard cell, and
- depositing one or more intra cell signal wires on no more than n number of horizontal routing tracks of a second metal layer overlaying a first metal layer of the standard cell, wherein the one or more intra cell signal wires interconnect the plurality of signal gates within the standard cell, and wherein $n < \frac{1}{2} m$.

26. The method according to claim 25 wherein $n \leq \frac{1}{4} m$.

27. The method according to claim 25 wherein $n \leq 2$.

28. The method according to claim 25 wherein each of the one or more intra cell signal wires of the second metal layer resides on a non-neighboring horizontal routing tracks with respect to a remainder of the intra cell signal wires.

29. The method according to claim 25 wherein each of the standard cells comprises one or more inter cell signal wires disposed on one or more horizontal routing tracks of the second metal layer other than the routing track occupied by the intra cell signal wires, the one or more inter cell signal wires coupling the respective standard cell with one or more other standard cells.

30. The method according to claim 29, wherein the second metal layer is M2.

* * * * *